(12) United States Patent
Aram et al.

(10) Patent No.: US 6,625,006 B1
(45) Date of Patent: Sep. 23, 2003

(54) FRINGING CAPACITOR STRUCTURE

(75) Inventors: Farbod Aram, Cupertino, CA (US); Sehat Sutardja, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 78 days.

(21) Appl. No.: 09/765,200

(22) Filed: Jan. 18, 2001

Related U.S. Application Data
(60) Provisional application No. 60/229,533, filed on Sep. 5, 2000.

(51) Int. Cl.[7] .................................................. H01G 4/20
(52) U.S. Cl. ..................... 361/313; 361/311; 361/306.1; 361/321.1; 361/320
(58) Field of Search ............................... 361/313, 306.3, 361/306.1, 311, 303, 304, 312.2, 309, 328, 329, 321.1, 301.1, 321.5, 320

(56) References Cited

U.S. PATENT DOCUMENTS

| | | | |
|---|---|---|---|
| 5,583,359 A | | 12/1996 | Ng et al. |
| 5,903,493 A | | 5/1999 | Lee |
| 6,001,702 A | | 12/1999 | Cook et al. |
| 6,150,707 A | | 11/2000 | Cook et al. |
| 6,266,226 B1 | * | 7/2001 | Hayashi |
| 6,266,227 B1 | * | 7/2001 | Konushi et al. |
| 6,312,963 B1 | * | 11/2001 | Chou et al. |
| 6,445,056 B2 | * | 9/2002 | Nakashima |
| 6,459,561 B1 | * | 10/2002 | Galvagni et al. |

OTHER PUBLICATIONS

Runsheng He, Nersi Nazari and Sehat Sutardja, "A DSP Receiver for 1000BASE–T PHY," Submitted to ISSCC 2001.

S.H. Lewis, R. Ramachandran "A 10–b 20–Msample/s Analog–to–Digital Converter," IEEE J. Solid–State Circuits, vol. 27, pp. 351–358, Mar. 1992.

S.H. Lewis and P.R. Gray, "A pipelined 5–Msample/s 9–bit analog to digital converter," IEEE J. Solid–State Circuits, vol. SC–22, pp. 954–961, Dec. 1987.

S. Sutarja and P.R. Gray, "A pipelined 13–bit, 250–ks/s, 5–V, analog–to–digital converter," IEEE J. Solid–State Circuits, vol. 23, pp. 1316–1323, Dec. 1988.

Bhupendra K. Ahuja, "An Improved Frequency Compensation Technique for CMOS Operational Amplifiers", IEEE J. Solid–State Circuits, vol. SC 18, No. 6, pp. 629–633, Dec. 1983.

\* cited by examiner

*Primary Examiner*—Anthony Dinkins
*Assistant Examiner*—Nguyen Ha
(74) *Attorney, Agent, or Firm*—Eric B. Janofsky; Harness, Dickey & Pierce, P.L.C.

(57) ABSTRACT

The present invention provides a circuit and method for a fringing capacitor. The fringing capacitor includes at least two conductor layers spaced apart from each other. Each conductor layer includes at least two portions. The portions include odd ones alternating with even ones. Adjacent odd ones and even ones of the portions are spaced apart. The odd ones of the portions on a first one of the conductor layers are configured to substantially overlay the odd ones of the portions on an adjacent one of the conductor layers. The even ones of the portions on the first one of the conductor layers are configured to substantially overlay the even ones of the portions on the adjacent one of the conductor layers. The odd ones of the portions on the first one of the conductor layers are electrically coupled together and to the even ones of the portions on the adjacent one of the conductor layers, thereby defining a first electrode. The even ones of the portions on the first one of the conductor layers are electrically coupled together and to the odd ones of the portions on the adjacent one of the conductor layers, thereby defining a second electrode. A dielectric is interposed between the first and second electrodes. A guardband is spaced from the first and second electrodes.

17 Claims, 9 Drawing Sheets

FRINGING CAPACITOR STRUCTURE

CROSS-REFERENCE TO RELATED APPLICATION

This application claims priority under 35 U.S.C. 119(e) from U.S. provisional application serial No. 60/229533, entitled "A 1000Base-T PHY Pipeline ADC", filed Sep. 5, 2000, the contents of which are incorporated by referenced herein.

BACKGROUND OF THE INVENTION

1. Field of the Invention

The present invention relates generally to capacitors, and in particular to capacitors that are implemented within a semiconductor device.

2. Discussion of the Related Art

Conventional capacitors that are fabricated on semiconductor devices for storing charge are typically configured as metal-to-metal capacitors (MOMs). Referring to FIG. 1, the construction of a typical MOM 10 is illustrated. The MOM 10 includes two electrodes 12 that are formed on conductor layers 14 and 16 that are separated by a dielectric 18. A substrate 19 forms a base for the MOM 10. In addition to the device capacitance which is formed between the electrodes, there is also an undesirable parasitic capacitance that is formed between the substrate 19 and adjacent electrode. In many conventional devices, the parasitic capacitance may exceed 20% of the value of the capacitance between the electrodes of the capacitor. To increase the value of capacitance, generally either the plate area of the MOM is increased, or the dielectric thickness is decreased. Both of these options have drawbacks. Increasing the plate area causes a further undesirable increase in the parasitic capacitance, while reducing the dielectric thickness requires an extra process step that significantly increases the cost of the device. In addition, the matching characteristics of conventional semiconductor capacitors are deficient due to the non-symmetrical effect of external fields on adjacent capacitors.

SUMMARY OF THE INVENTION

The present invention provides a circuit and method for a fringing capacitor. The fringing capacitor includes at least two conductor layers spaced apart from each other. Each conductor layer includes at least two portions. The portions include odd ones alternating with even ones. Adjacent odd ones and even ones of the portions are spaced apart. The odd ones of the portions on a first one of the conductor layers are configured to substantially overlay the odd ones of the portions on an adjacent one of the conductor layers. The even ones of the portions on the first one of the conductor layers are configured to substantially overlay the even ones of the portions on the adjacent one of the conductor layers. The odd ones of the portions on the first one of the conductor layers are electrically coupled together and to the even ones of the portions on the adjacent one of the conductor layers, thereby defining a first electrode. The even ones of the portions on the first one of the conductor layers are electrically coupled together and to the odd ones of the portions on the adjacent one of the conductor layers, thereby defining a second electrode. A dielectric is interposed between the first and second electrodes. A guardband is spaced from the first and second electrodes.

For a more complete understanding of the invention, its objects and advantages, reference may be had to the following specification and to the accompanying drawings.

DETAILED DESCRIPTION OF THE PREFERRED EMBODIMENT

Figure 1:
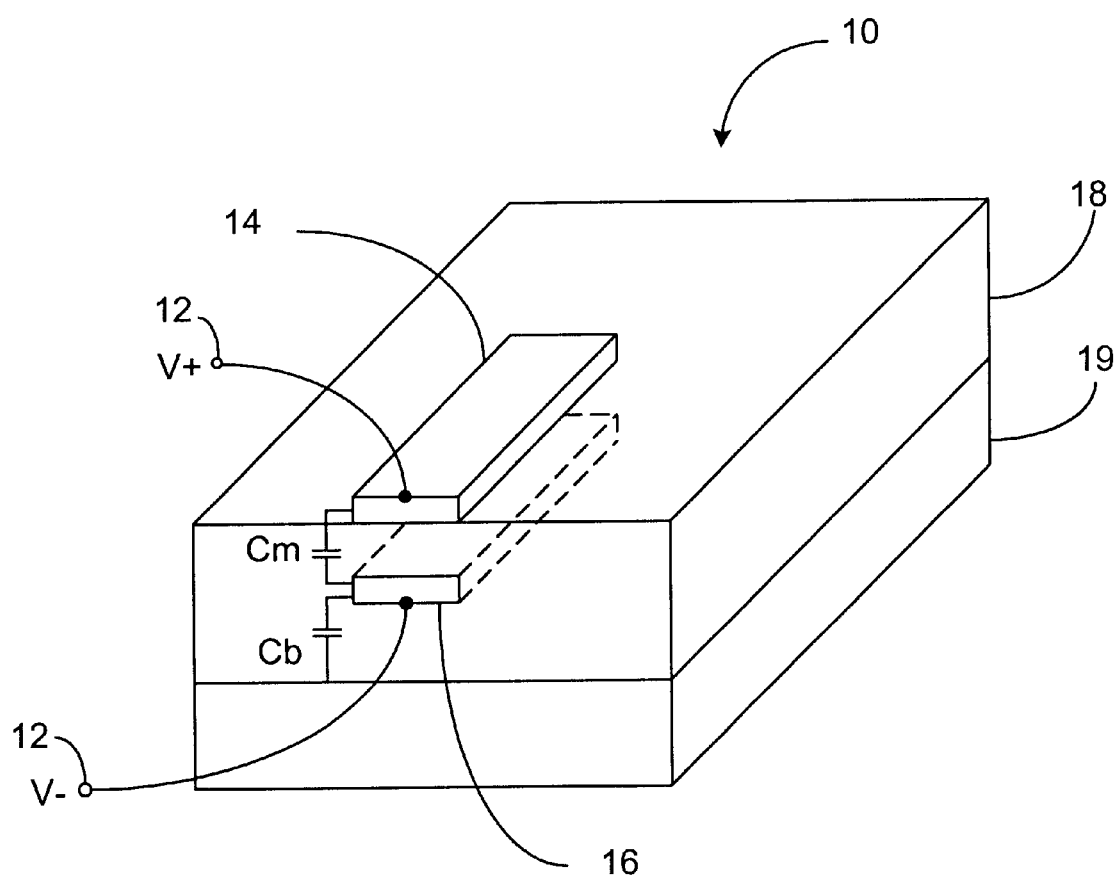
FIG. 1 illustrates a conventional metal-on-metal capacitor.
Figure 2A:
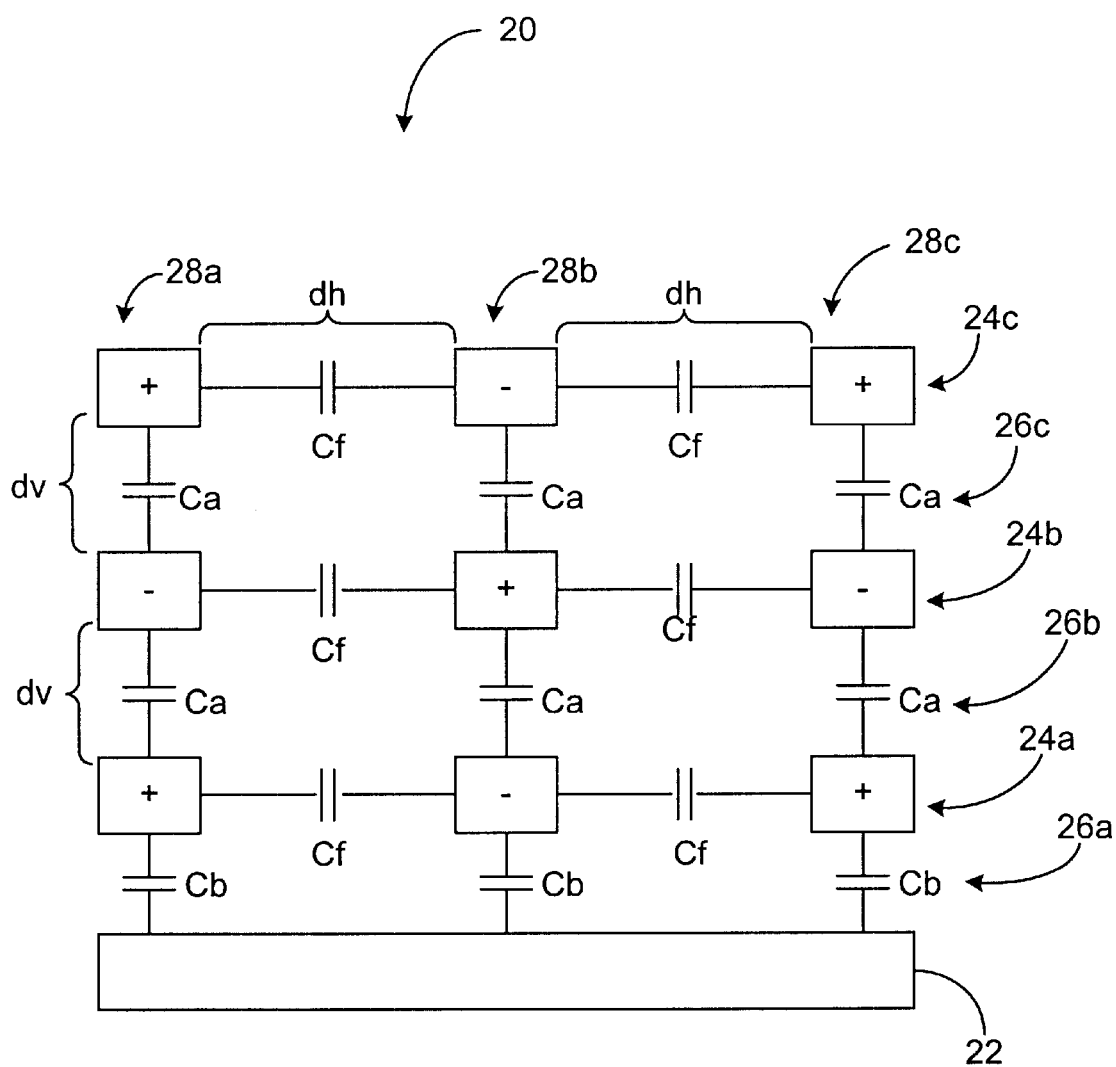
FIG. 2A illustrates a side-view of an embodiment of a fringing capacitor in accordance with the principles of the invention.
Figure 2B:
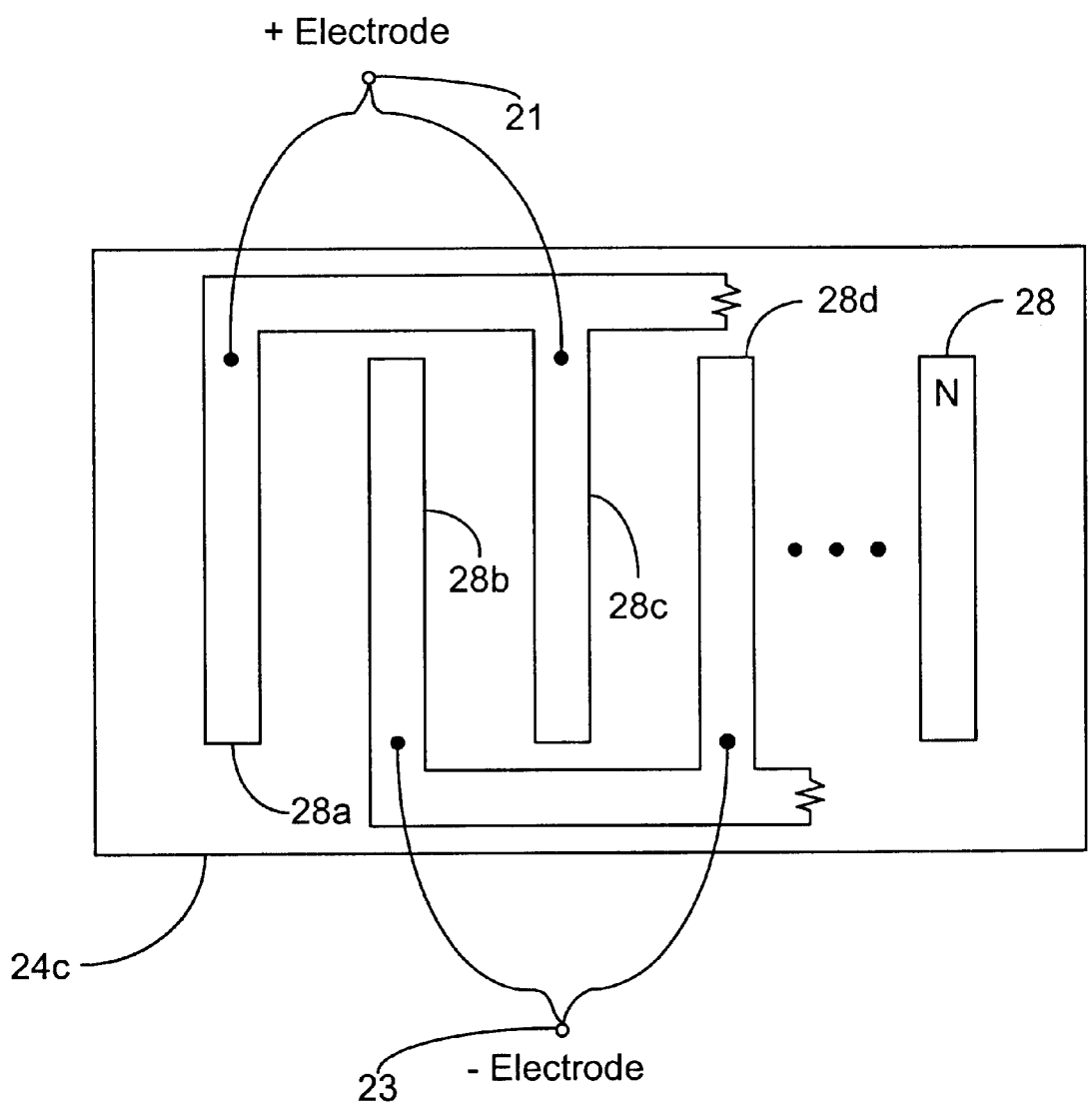
FIG. 2B illustrates a top-view of an embodiment of a fringing capacitor in accordance with the principles of the invention.

Referring to FIGS. 2A and 2B, illustrated are side and top views of a presently preferred embodiment of a fringing capacitor 20 fabricated on a semiconductor substrate 22 in accordance with the principles of the present invention. The fringing capacitor is particularly suitable for fabricating the device by using a conventional thin metal oxide process. The thin metal oxide process advantageously is less costly than complementary metal oxide semiconductor (CMOS) processes. However, using other semiconductor processes such as CMOS are also within the scope of the invention. The fringing capacitor 20 is particularly suitable for applications that require matched capacitors and high-density packaging.

The fringing capacitor 20 has a positive electrode 21 and a negative electrode 23. The positive and negative electrodes 21 and 23 are configured so that the device capacitance is formed between a combination of intralayer conductors as well as interlayer conductors. The fringing capacitor 20 includes two or more conductor layers 24 separated by associated dielectric layers 26 for forming interlayer capacitance. Dielectric layers 26 and conductor layers 24 are alternately stacked upon the substrate 22. A first dielectric layer 26a is deposited on the substrate 22. Then a first conductor layer 24a is fabricated on top of the first dielectric layer 26a. The dielectric layers 26 and conductor layers 24 continue to be alternately deposited to whatever number of layers is selected.

The conductor layers are preferably formed from aluminum, however any suitable conductive material is within the scope of the invention including copper, polysilicon, tungsten, gold, and silicon alloys such as titanium silicide. Fabricated on each of the conductor layers 24 are multiple conductor legs 28 for forming an intralayer capacitance, Cf. The conductor legs 28 are formed to follow substantially parallel paths with a dielectric disposed between them. Adjacent conductor legs 28 are coupled to opposing electrodes. Preferably, the conductor legs 28 are configured to follow straight runs with every other conductor leg being coupled to a common electrode polarity. However, it is within the scope of the invention for the conductor legs 28 to have other path configurations such as circular, L-shaped, and spiral. Adjacent conductor legs are preferably separated approximately by a distance $d_h$ along the path of the conductors so that an intralayer capacitance, Cf, is formed between the adjacent conductor legs. In the presently preferred embodiment, the distance $d_h$ is selected to be 0.3 um.

Similarly, the conductor legs 28 on each layer are arranged to overlay the conductor legs 28 on adjacent conductor layers so that an interlayer capacitance, Ca, is formed between the conductor legs 28 of the adjacent conductor layers. Preferably, the dielectric layer 24 that is sandwiched between the adjacent conductor layers 28 is fabricated with a uniform thickness of $d_v$. In the presently preferred embodiment the dielectric layers 24 are fabricated with a thickness $d_v$ of 1 um. The total capacitance, Cf, of the device is equal to the combination of Ca plus Cf. Preferably, Ca comprises about 20% of the total capacitance and Cf comprises about 80% of the total capacitance.

A parasitic capacitance, $C_b$, is also formed, being caused by the interaction between the substrate 22 and the nearest conductor layer 24. The ratio Cb/Ct provides a figure of merit indicating the quality of the fringing capacitor 20. The lower the value of Cb/Ct, the higher the quality of the fringing capacitor 20. The value of Cb/Ct can be driven lower by increasing the number of conductor legs 28 on each conductor layer 24, and by increasing the number of conductor layers 24.

The fringing capacitor 20 is preferably fabricated with a total of three conductor layers. However, using two or more conductor layers 24 is within the scope of the invention. In conventional semiconductor capacitors, the value of the parasitic capacitance coupled to the substrate typically exceeds 20% of the value of the capacitance formed between the conductor layers. Relying on the fringing capacitance as well as employing multiple conductor layers 24 in the present invention improves the volumetric efficiency and reduces the value of parasitic capacitance, Cb, to less than 20% of the total capacitance.

Figure 3A:
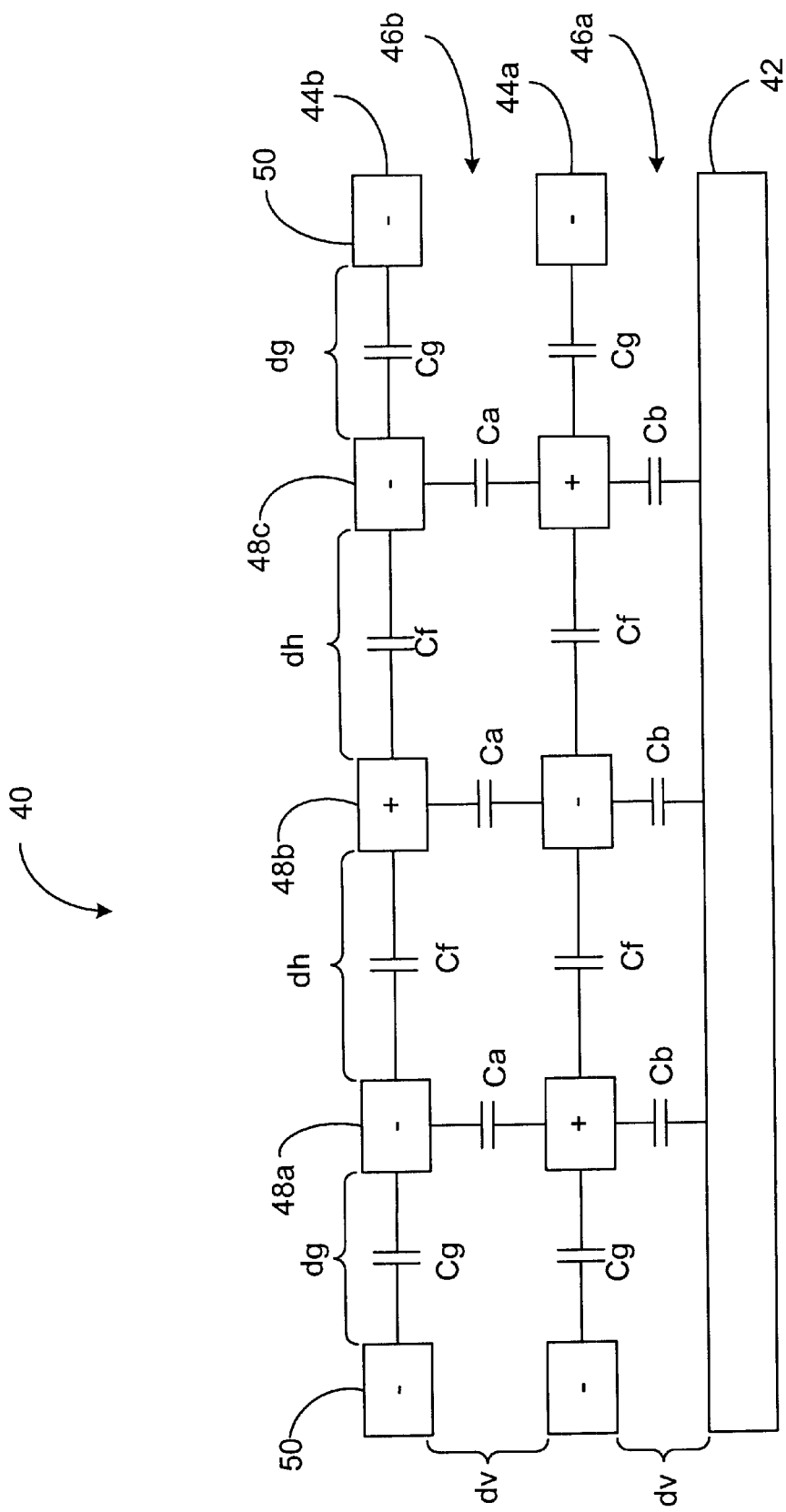
FIG. 3A illustrates a side-view of a presently preferred embodiment of a fringing capacitor in accordance with the principles of the invention.
Figure 3B:
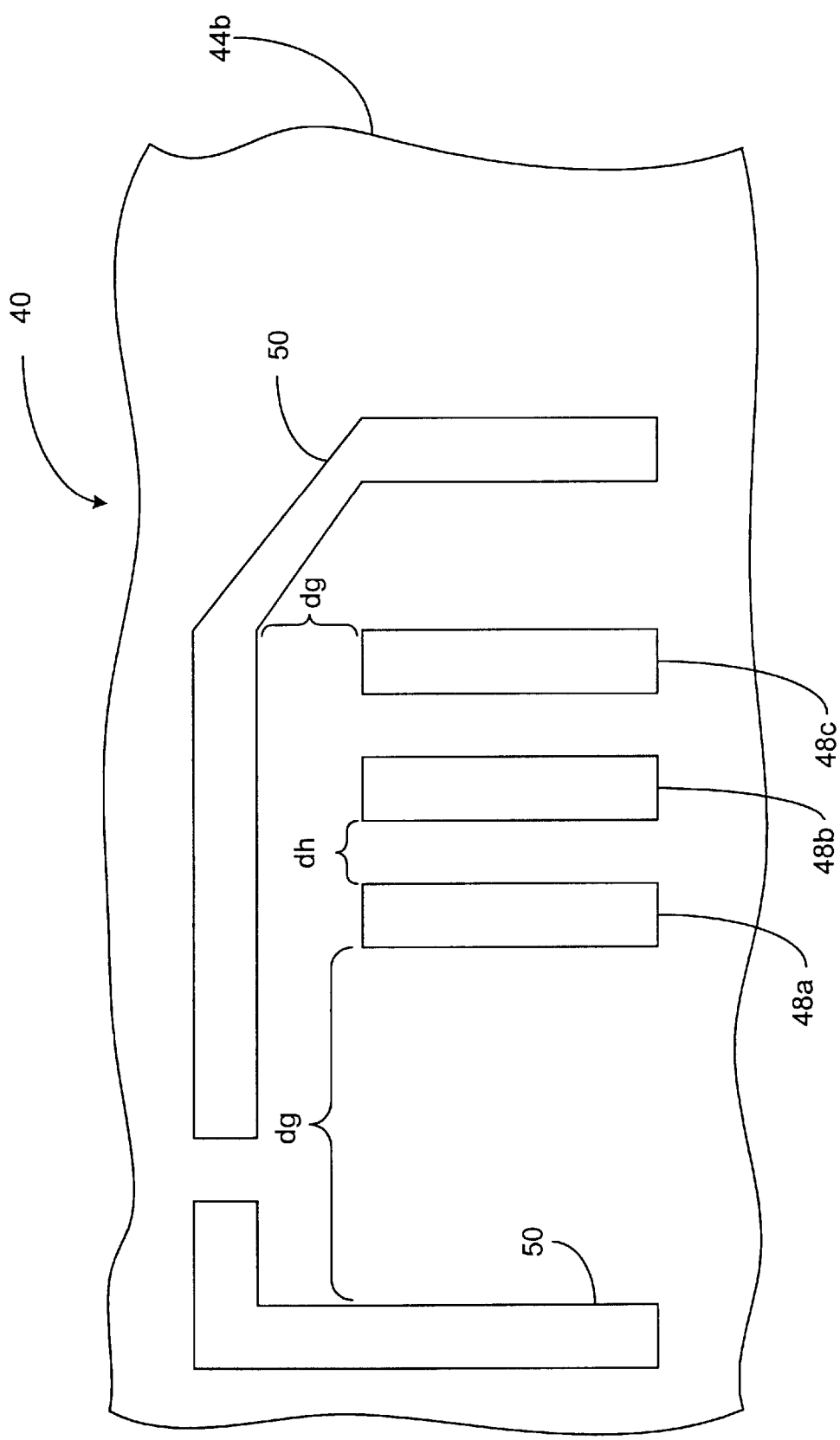
FIG. 3B illustrates a top-view of a presently preferred embodiment of a fringing capacitor in accordance with the principles of the invention.

Referring to FIGS. 3A and 3B, a second embodiment of a fringing capacitor 40 in accordance with the principles of the invention is illustrated. The fringing capacitor 40 is similar to fringing capacitor 20 in function with corresponding elements numbered in the range 40–49, except that fringing capacitor 40 includes a guardband 50 for attenuating coupling between the fringing capacitor 40 and external electromagnetic fields. The guardband 50 is preferably formed from a conductive material such as polysilicon, aluminum, and copper. In the preferred embodiment, the guardband 50 is provided on each conducting layer 44 and substantially encircles the electrodes of fringing capacitor 40. However, the scope of the invention includes providing the guardband on less than all of the conducting layers 44, and only running the guardband 50 along one side of the fringing capacitor 40. In addition, the guardband 50 may be included on layers either above or below the fringing capacitor. Preferably, the guardband 50 is spaced from the conductors a distance dg that is approximately twice the distance dh between adjacent conductor legs 48. The distance dg is selected to minimize the parasitic fringing capacitance that is formed between the guardband 50 and the conductor legs 48, while at the same time maintaining a volumetrically efficient fringing capacitor 40. To maintain a predetermined ratio between the capacitance of the fringing capacitor 40 and the parasitic capacitance formed from the guardband 50, the distance dg is preferably increased when there are fewer conductor layers 44 or conductor legs 48, and the distance dg is preferably decreased when there are more conductor layers 44 or conductor legs 48. Preferably the line width of the guardband 50 is selected to be the same as the conductor legs 48, however the scope of the invention is not limited by the line width that is selected. Preferably the guardband 50 is coupled through a low impedance to a voltage potential such as ground reference, however the scope of the invention includes permitting the guardband to float with respect to system voltage potentials.

Figure 4A:
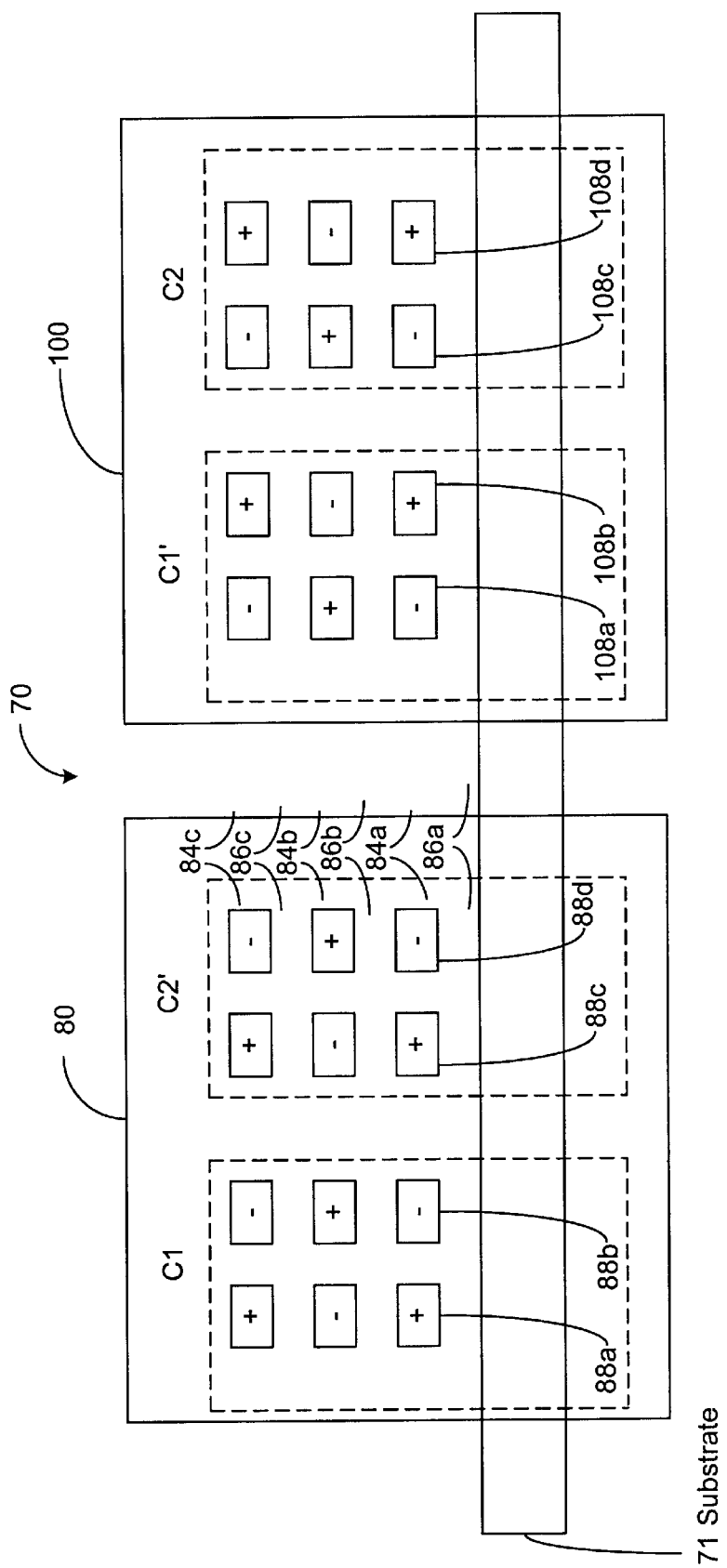
FIGS. 4A, 4B, and 4C illustrate side and top-views of split-capacitance embodiments of a fringing capacitor in accordance with the principles of the invention.

Referring to FIG. 4A, an embodiment of a split-capacitance fringing capacitor 70 in accordance with the principles of the invention is shown. The split fringing capacitor 70 is particularly suitable in matched capacitor applications such as sample and hold capacitors, capacitor arrays in D/A and A/D converters, and especially multiplying D/A converters. The split-capacitance fringing capacitor 70 includes a first fringing capacitor 80 and a second fringing capacitor 100. The first fringing capacitor 80 is similar to fringing capacitor 20 in structure with corresponding elements numbered in the range 80–89, except that fringing capacitor 80 divides the conductor legs 88 to form two capacitors C1 and C2'. The second fringing capacitor 100 is also similar to fringing capacitor 20 in structure with corresponding elements numbered in the range 100–109, except that fringing capacitor 100 likewise divides the conductor legs 108 to form two capacitors C2 and C1'. Capacitors C1 and C1' are interconnected forming a first capacitor, and capacitors C2 and C2' are interconnected forming a second capacitor. Preferably, C1, C1', C2, and C2' have equivalent capacitances, however the scope of the invention includes forming the capacitors with dissimilar capacitances as well as asymmetrical capacitances such as C1=C2 and C1'=C2', or C1=C2=C1'=C2'.

Figure 4B:
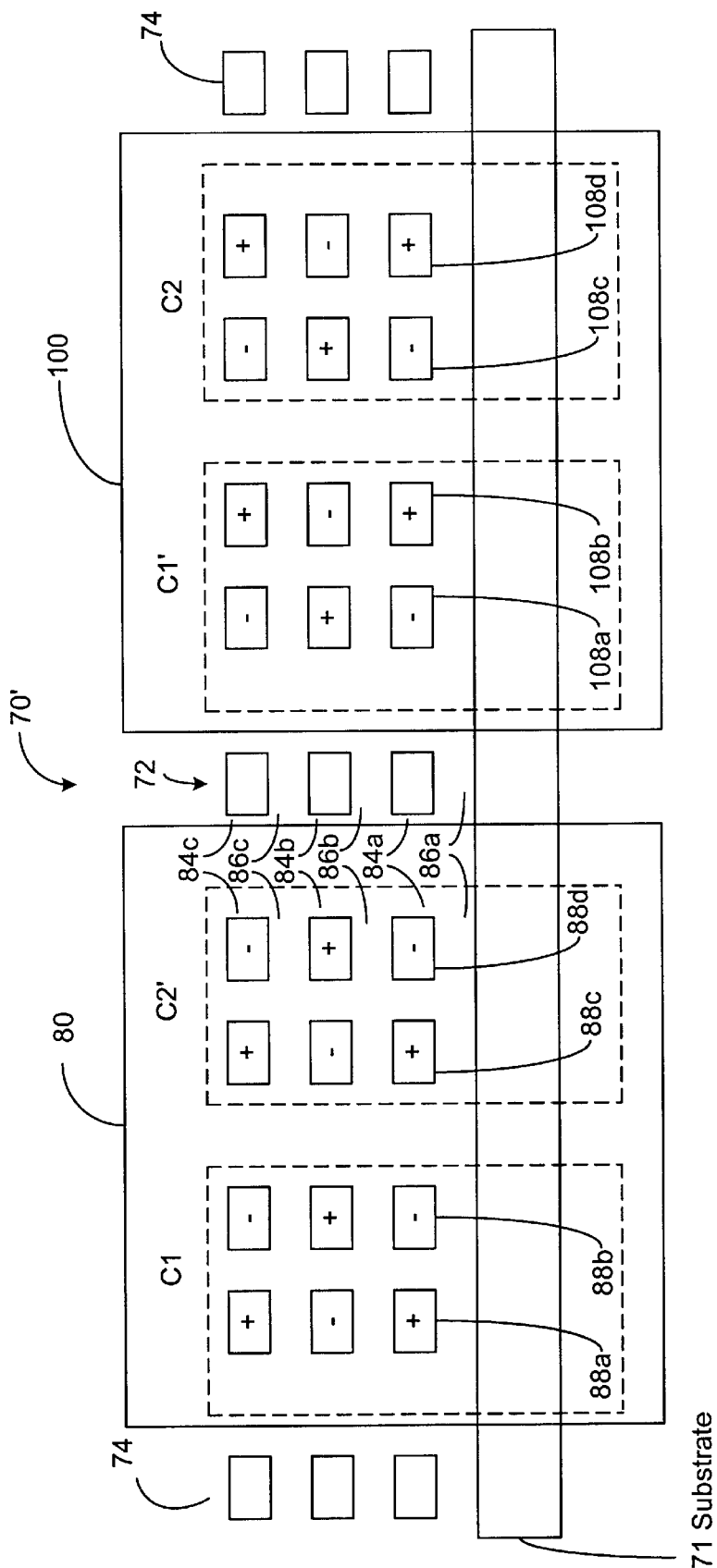

Referring to FIG. 4B, another embodiment of a split-capacitance fringing capacitor 70' in accordance with the principles of the invention is shown. The split fringing capacitor 70' is similar to split fringing capacitor 70, except that split fringing capacitor 70' includes guardbands 72 and 74 to shield the components of the split fringing capacitor 70'.

Figure 4C:
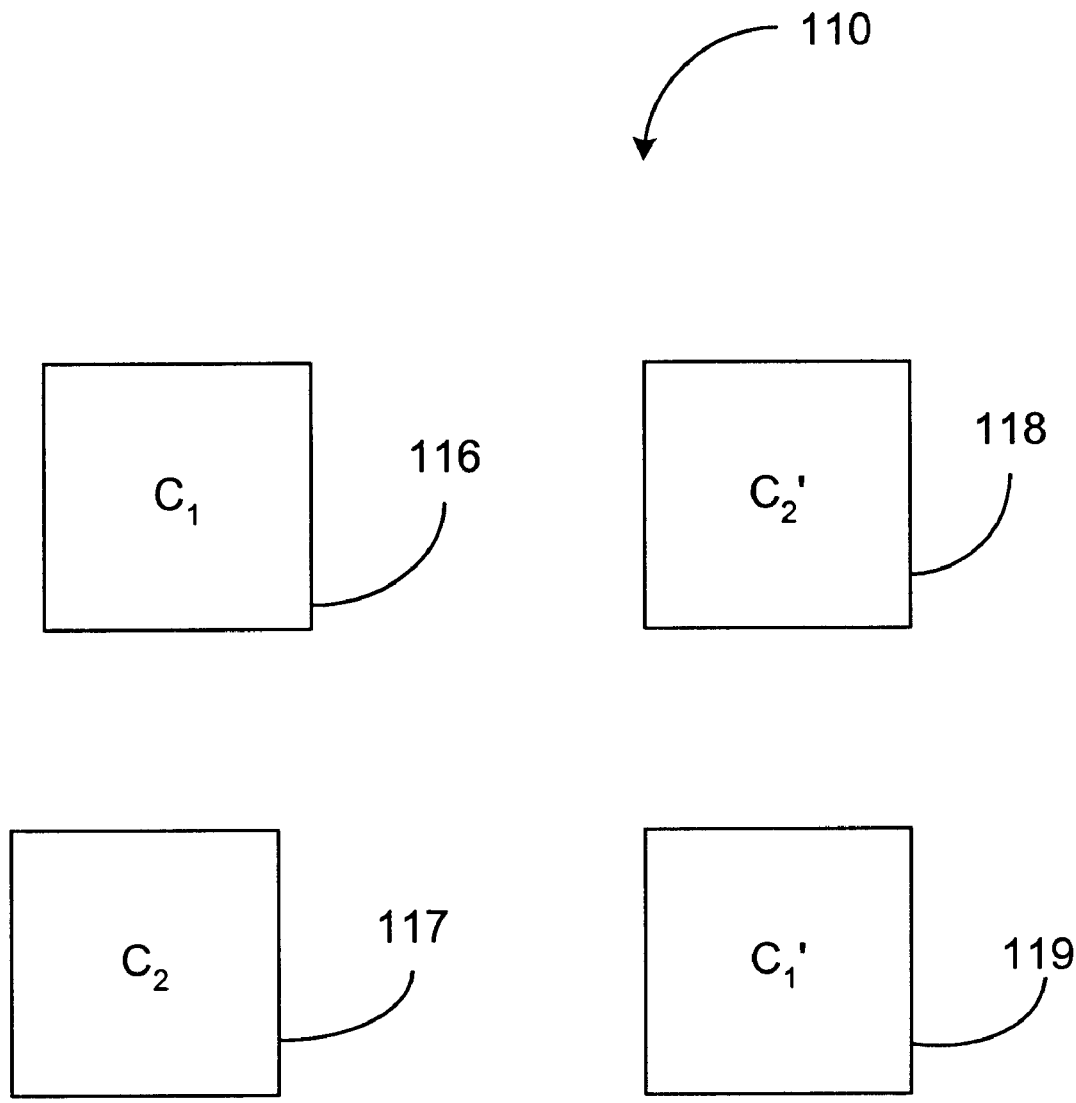

Referring to FIG. 4C, a top-view of an embodiment of a split-capacitance fringing capacitor 110 in accordance with the principles of the invention is shown. The split-capacitance fringing capacitor 110 includes four fringing capacitors 116–119, preferably arranged side-by-side forming a two-by-two square. The fringing capacitors 116–119 are similar in function and construction to fringing capacitors described in earlier sections of this specification. Preferably, one capacitor of a set of matched capacitors is formed by cross-connecting the fringing capacitors 116 and 119. A second capacitor of a set of matched capacitors is formed by cross-connecting the fringing capacitors 117 and 118. Cross-connecting the fringing capacitors minimizes the impact of coupling between the fringing capacitors 116–119 and external electromagnetic fields.

Figure 5:
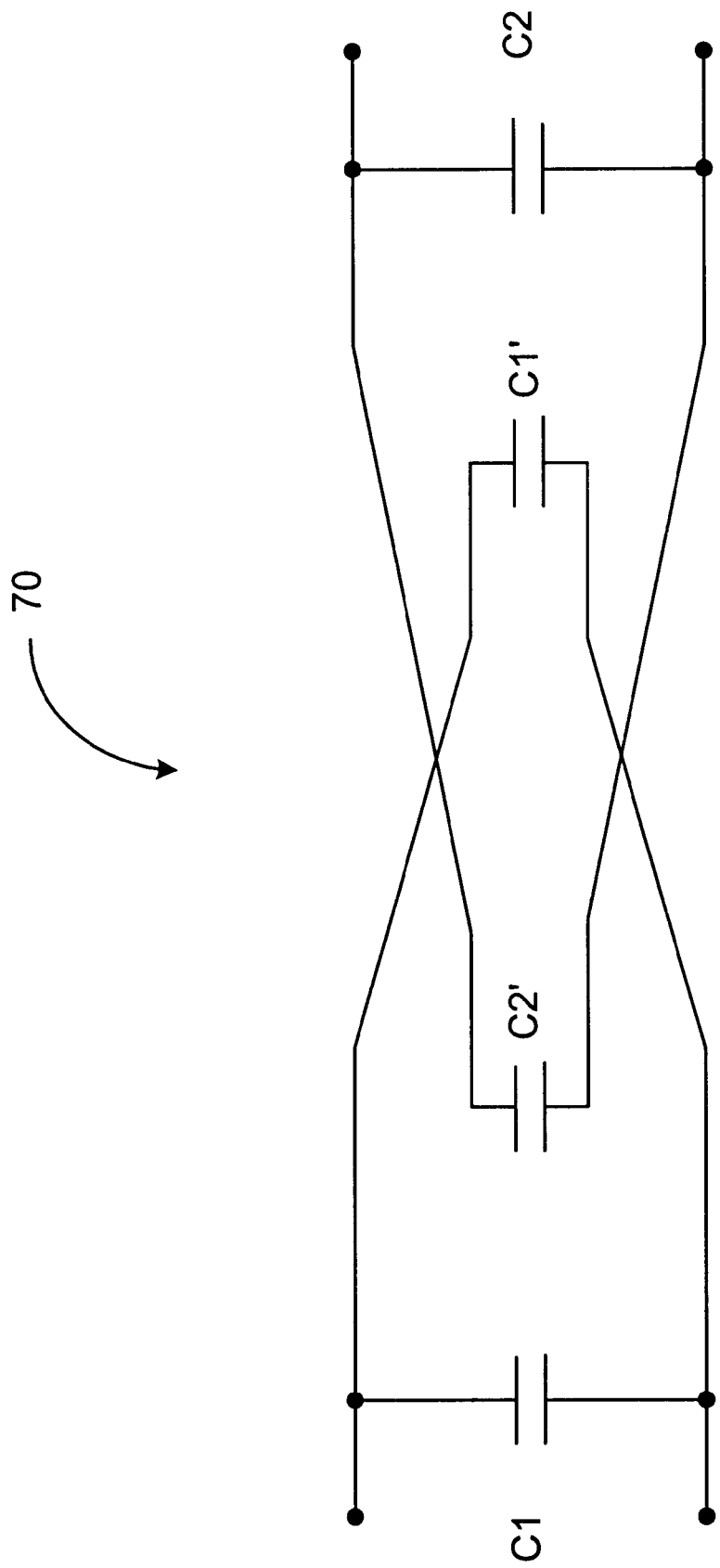
FIG. 5 is a schematic diagram that represents a split-capacitance embodiment of a fringing capacitor in accordance with the principles of the invention.

Additionally referring to FIG. 5, capacitors C1 and C1' are interconnected forming capacitor Ca, and capacitors C2 and C2' are interconnected forming capacitor Cb. Preferably, C1, C1', C2, and C2' have equivalent capacitances, however the scope of the invention includes forming the capacitors with dissimilar capacitances as well as asymmetrical capacitances such as C1=C2 and C1'=C2', or Ca Cb and C1 C2 C1' C2'. Preferably, a guardband 72 in accordance with the above description related to fringing capacitor 40, is interposed between the first and second fringing capacitors 80 and 100 to attenuate coupling between the two fringing capacitors 80 and 100. In addition, outer guardbands 74 in accordance with the above description, preferably encircle the split-capacitance fringing capacitor 70'. Preferably, the fringing capacitors 80 and 100 include an even number of ten or more conductor legs 88 and 108 on three or more conductor layers 84 to facilitate splitting the capacitors into even valued devices, providing a matching property for the split-capacitance fringing capacitor 70' of about 0.1%. Increasing the number of conductor legs 88 and 108, and maintaining an even number of conductor legs 88 and 108 improves the matching property of the split-capacitance fringing capacitor 70'.

Thus it will be appreciated from the above that as a result of the present invention, a circuit and method for constructing a capacitor is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A fringing capacitor for storing energy, comprising:
   at least two conductor layers spaced apart from each other;
   each conductor layer including at least two portions, the portions including odd ones alternating with even ones, adjacent odd ones and even ones of the portions spaced apart;
   the odd ones of the portions on a first one of the conductor layers are configured to substantially overlay the odd ones pf the portions on an adjacent one of the conductor layers,
   the even ones of the portions on the first one of the conductor layers are configured to substantially overlay the even ones of the portions on the adjacent one of the conductor layers;
   the odd ones of the portions on the first one of the conductor layers being electrically coupled together and to the even ones of the portions on the adjacent one of the conductor layers thereby defining a first electrode;
   the even ones of the portions on the first one of the conductor layers being electrically coupled together and to the odd ones of the portions on the adjacent one of the conductor layers thereby defining a second electrode;
   a dielectric interposed between the first and second electrodes; and
   a guardband being spaced from the first and second electrodes.

2. The capacitor of claim 1 wherein the guardband is comprised of a conductive material.

3. The capacitor of claim 2 wherein the conductive material is selected from the group of aluminum, polysilicon, and copper.

4. The capacitor of claim 1 wherein the guardband is spaced approximately a predetermined distance dg from the first and second electrodes;
   wherein the adjacent odd ones and even ones of the portions are spaced apart approximately a predetermined distance dh; and
   wherein the distance dg is selected to be about twice the distance dh.

5. The capacitor of claim 1 wherein the guardband is located on a single layer.

6. The capacitor of claim 1 wherein the guardband is distributed over multiple layers.

7. The capacitor of claim 1 wherein the guardband encircles the capacitor.

8. A fringing capacitor for storing energy, comprising:
   at least two conductor layers spaced apart from each other;
   each conductor layer including at least two portions, the portions including odd ones alternating with even ones, adjacent odd ones and even ones of the portions spaced apart;
   the odd ones of the portions on a first one of the conductor layers are configured to substantially overlay the odd ones of the portions on an adjacent one of the conductor layers,
   the even ones of the portions on the first one of the conductor layers are configured to substantially overlay the even ones of the portions on the adjacent one of the conductor layers;
   the odd ones of the portions on the first one of the conductor layers being electrically coupled together and to the even ones of the portions on the adjacent one of the conductor layers thereby defining a first electrode;
   the even ones of the portions on the first one of the conductor layers being electrically coupled together and to the odd ones of the portions on the adjacent one of the conductor layers thereby defining a second electrode;
   a means for dielectrically separating being interposed between the first and second electrodes; and
   a means for shielding being spaced from the first and second electrodes.

9. The capacitor of claim 8 wherein the shielding means is comprised of a conductive material.

10. The capacitor of claim 8 wherein the shielding means is spaced approximately a predetermined distance dg from the first and second electrodes;
    wherein adjacent odd ones and even ones of the portions are spaced apart approximately a predetermined distance dh; and
    wherein the distance dg is selected to be about twice the distance dh.

11. The capacitor of claim 8 wherein the shielding means is distributed over multiple layers.

12. A fringing capacitor comprising:
    a first electrode comprising:
      a first portion arranged on a first layer; and
      a second portion arranged on a second layer; and
    a second electrode comprising:
      a first portion arranged over said first portion of said first electrode and adjacent to said second portion of said first electrode; and
      a second portion arranged under said second portion of said first electrode and adjacent to said first portion of said first electrode;
    a dielectric interposed between said first and second electrodes; and
    a guardband being spaced from said first and second electrodes.

13. The capacitor of claim 12 wherein the guardband is formed from a conductive material that is selected from the group of aluminum, polysilicon, and copper.

14. The capacitor of claim 12 wherein the guardband is spaced approximately a predetermined distance dg from the electrodes;

wherein adjacent odd ones and even ones of the portions are spaced apart approximately a predetermined distance dh; and wherein the distance dg is selected to be about twice the distance dh.

15. The capacitor of claim 12 wherein the guardband is located on a single layer.

16. The capacitor of claim 12 wherein the guardband is distributed over multiple layers.

17. The capacitor of claim 12 wherein the guardband encircles the capacitor.

* * * * *

UNITED STATES PATENT AND TRADEMARK OFFICE
CERTIFICATE OF CORRECTION

PATENT NO. : 6,625,006 B1 Page 1 of 1
APPLICATION NO. : 09/765200
DATED : September 23, 2003
INVENTOR(S) : Farbod Aram et al.

It is certified that error appears in the above-identified patent and that said Letters Patent is hereby corrected as shown below:

Column 5, Line 32         Delete "pf" after "ones" and insert -- of --

Signed and Sealed this

Fifteenth Day of January, 2008

JON W. DUDAS
*Director of the United States Patent and Trademark Office*